United States Patent
Nakatani

(10) Patent No.: US 11,074,983 B2
(45) Date of Patent: Jul. 27, 2021

(54) VOLTAGE-GENERATING CIRCUIT AND SEMICONDUCTOR DEVICE

(71) Applicant: Winbond Electronics Corp., Taichung (TW)

(72) Inventor: Masafumi Nakatani, Yokohama (JP)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/891,734

(22) Filed: Jun. 3, 2020

(65) Prior Publication Data
US 2020/0388340 A1 Dec. 10, 2020

(30) Foreign Application Priority Data

Jun. 5, 2019 (JP) .............................. JP2019-105039

(51) Int. Cl.
*G05F 1/00* (2006.01)
*G11C 16/30* (2006.01)
*H02M 3/07* (2006.01)
*G11C 16/08* (2006.01)

(52) U.S. Cl.
CPC .............. *G11C 16/30* (2013.01); *G11C 16/08* (2013.01); *H02M 3/07* (2013.01)

(58) Field of Classification Search
CPC ......... G11C 16/30; G11C 16/08; G11C 5/147; G11C 8/08; G11C 5/145; H02M 3/07; H02M 2001/0025
USPC ....................................................... 327/536
See application file for complete search history.

(56) References Cited

U.S. PATENT DOCUMENTS

| 7,505,290 | B2* | 3/2009 | Fujiwara | H02M 3/07 363/60 |
| 7,936,154 | B2* | 5/2011 | Lee | G11C 5/145 323/266 |
| 8,120,411 | B1 | 2/2012 | Liu et al. | |
| 2005/0189983 | A1* | 9/2005 | Sivero | H02M 3/07 327/536 |
| 2009/0108218 | A1* | 4/2009 | Minnigh | A61B 6/4494 250/588 |

(Continued)

FOREIGN PATENT DOCUMENTS

| CN | 1893245 B | 6/2010 |
| CN | 203775142 U | 8/2014 |

(Continued)

*Primary Examiner* — Ryan Jager
(74) *Attorney, Agent, or Firm* — Birch, Stewart, Kolasch & Birch LLP

(57) ABSTRACT

What is provided is a voltage-generating circuit that uses dynamic reference voltage to accurately control the step-up of a generated voltage. A voltage-generating circuit 100 of the invention includes a charge pump 110 outputting voltage Vpump, a regulator 120, and a controlling circuit 140. The regulator 120 includes a comparator 122 and a comparator 132. The comparator 122 compares voltage Vdivide generated by the charge pump 110 with a reference voltage Vref, and outputs a comparison result CMP_OUT. The comparator 132 compares voltage Vdivide2 generated by the charge pump 110 with a reference voltage VrefRRC with a controlled rising speed, and outputs a comparison result CMP2_OUT. The controlling circuit 140 controls the charge pump 110 based on CMP_OUT and CMP2_OUT.

8 Claims, 8 Drawing Sheets

(56) References Cited

U.S. PATENT DOCUMENTS

2017/0012523 A1* 1/2017 Pan ..................... H02M 3/07

FOREIGN PATENT DOCUMENTS

| | | |
|---|---|---|
| DE | 10 2005 020 895 A1 | 5/2006 |
| JP | 62-285298 A | 12/1987 |
| JP | 6501325 B1 | 4/2019 |
| TW | 201346925 A | 11/2013 |
| TW | 201611023 A | 3/2016 |
| TW | 201629953 A | 8/2016 |

* cited by examiner

VOLTAGE-GENERATING CIRCUIT AND SEMICONDUCTOR DEVICE

CROSS REFERENCE TO RELATED APPLICATIONS

This application claims priority of Japanese Patent Application No. 2019-105039, filed on Jun. 5, 2019, the entirety of which is incorporated by reference herein.

BACKGROUND OF THE INVENTION

Field of the Invention

The present invention relates to a voltage-generating circuit, and, in particular, to the rising speed control of a voltage generated by a device such as a charge pump.

Description of the Related Art

In a memory device such as a NAND type or NOR type flash memory, high voltage is required for data reading, programming, and erasing operations. Usually in the flash memory, the charge pump boosts the power supply voltage provided externally, and the boosted voltage is used to perform programming or erasing. For example, Japanese Patent No. 6501325 discloses a voltage-generating circuit that does not use a level shifter, but generates the driving voltage from the voltage boosted by the charge pump.

BRIEF SUMMARY OF THE INVENTION

In the NAND type flash memory, high voltage is applied to the word line during programming, and high voltage is applies to the P-well during erasing; the rising waveform of these voltages will have a significant impact on performance and reliability and will be important. Usually, these voltages are generated by using the charge pump and the regulator.

FIG. 1 is an example of the voltage-generating circuit of the flash memory. The voltage-generating circuit 10 comprises a charge pump 20, a regulator 30, and a controlling circuit 40. The charge pump 20 boosts the input voltage in response to the clock signal CLK, and outputs the boosted voltage Vpump from the output node N1. The regulator 30 is connected to the charge pump 20. The controlling circuit 40 controls the operation based on the output signal from the regulator 30. The output voltage Vpump generated from the voltage generating circuit 10, for example, can be provided to the word line driving circuit 50.

FIG. 2A shows an example of the charge pump. The charge pump 20 comprises a plurality of diode-connected MOS transistors, and each of the MOS transistors is connected in series. In addition, the capacitor is connected to the gate of each of the MOS transistors, the clock signal CLK1 is applied to each capacitor of odd-numbered MOS transistor, and the clock signal CLK2 is applied to each capacitor of even-numbered MOS transistor. The clock signal CLK1 and the clock signal CLK2 have a phase difference of 180 degrees as shown in FIG. 2B.

The regulator 30 comprises a resistance voltage divider and a comparator 32. The comparator 32 compares the voltage at the node N2 of the resistance voltage divider with the reference voltage Vref. The resistance voltage divider comprises a resistor ladder connected between the output node N1 and the ground; and the variable resistor VR is connected between the output node N1 and the node N2. The resistance of the variable resistor VR is set according to the trim code output from the logic 60. After the output voltage Vpump at the node N1 is divided, the voltage Vdivide is generated at the node N2. The higher the resistance of the variable resistor VR is, the lower the voltage division ratio is, and the lower the voltage Vdivide is; on the contrary, the lower the resistance of the variable resistor VR is, the higher the voltage division ratio is, and the higher the voltage Vdivide is. The reference voltage Vref, for example, can be generated by the band gap reference.

The comparator 32 compares the voltage Vdivide at the node N2 with the reference voltage Vref, when the voltage Vdivide is lower than the reference voltage Vref, the comparator 32 outputs the comparison result CMP_OUT in H level; in contrast, after the voltage Vdivide reaches the reference voltage Vref, the comparator 32 outputs the comparison result CMP_OUT in L level.

When the power is supplied, the logic 60 outputs the trim code to the variable resistor VR based on the setting information stored in the fuse memory. The setting information is used to compensate the variation caused by the process/voltage/temperature (PVT) or operation deviation of the voltage-generating circuit 10. In addition, in order to generate the voltage required for the flash memory operation (reading operation, programming operation, and erasing operation), the logic 60 can output the trim code corresponding to the operation sequence to the variable resistor VR.

The controlling circuit 40 comprises an AND gate, the AND gate receives the comparison result CMP_OUT of the comparator 32 and the clock signal, and outputs the signal for enabling or disabling the charge pump. That is, when the voltage Vdivide at the node N2 is lower than the reference voltage Vref, the comparison result CMP_OUT is in H level, and the charge pump 20 is enabled. In contrast, after the voltage Vdivide reaches the reference voltage Vref, the comparison result CMP_OUT is in L level, and the charge pump 20 is disabled.

FIG. 3 shows the waveform of the output voltage Vpump generated by the voltage-generating circuit 10. The figure shows the waveform of the output voltage Vpump when the logic 60 outputs the trim code "14h", and the waveform of the output voltage Vpump changed in stages when the logic 60 outputs the different trim codes. In addition, the solid line and the dashed line are used to illustrate the variations that the process may cause: the solid line illustrates cases where the charge pump 20 has the best boosting ability, so the time to reach the target voltage is short; while the dashed line illustrates cases where the charge pump 20 has the worst boosting ability, so the time to reach the target voltage is long.

After the variable resistor VR is set according to the trim code "14h", the resistance of the variable resistor VR is relatively high, and the voltage Vdivide at the node N2 drops to a low level by dividing the output voltage Vpump at the node N1 with a small ratio. Unless the output voltage Vpump reaches a high level of the target voltage, the voltage Vdivide will not exceed the reference voltage Vref. In this way, since the comparison result CMP_OUT of the comparator 32 is always kept at the H level and reaches the target voltage, the charge pump 20 will continue to boost.

FIG. 4A shows the I-V characteristic of the charge pump. The vertical axis is the output current I, and the horizontal axis is the output voltage V. As shown in the figure, the output current of the charge pump is not fixed and decreases as the output voltage gets higher. The DC model of this charge pump is shown in FIG. 4B, which is represented by a high voltage source with an output resistor Rout. The rising waveform of the output voltage of the charge pump imitates an exponential function of the RC time constant; the waveform of the output voltage Vpump is shown in FIG. 3, the voltage rises sharply in the low range, and then rises gradually in the high range.

In addition to the variation shown by the solid line and the dashed line, the charge pump 20 may also vary due to the operating power supply voltage or the temperature. In addition, in the flash memory with the multi-plane structure, the load capacitance of the word line and the P-well will change according to the number of the selected planes. As described above, the rising speed of the output voltage Vpump generated by the charge pump 20 will vary.

In order to restrain the variation of the rising speed of the output voltage Vpump, a method of controlling the rising speed of the output voltage Vpump can be adopted. In other word, it is a method to make the DAC signal (trim code) of the variable resistor VR provided to the regulator 30 increase with time. Specifically, as shown in FIG. 3, the logic 60 updates the resistance of the variable resistor VR with time according to the trim codes "04h", "08h", "0Ch", "10h", "12h", and "14h", to adjust the current of the resistance voltage divider and the voltage Vdivide at the node N2. By this way, the comparison result CMP_OUT of the comparator is shifted between the H level and the L level, the charge pump 20 is operated/not operated repeatedly, the step-up of the output voltage Vpump is controlled in stages, and reaches the output voltage Vpump designated by "14h" eventually.

As described above, in this method, the increment speed of the DAC signal (trim code) can be controlled to be the same as or slower than the rising speed of the charge pump in the worst case when the process/voltage/temperature/operating condition varies. If the DAC signal increases at a certain speed, the speed must be controlled to be lower than the rising speed which is integrated in the worst case of the charge pump at the high voltage range, therefore, at the low voltage range, the current of the charge pump needs to be restrained additionally, it takes a long time before the end of rising. In addition, in order to rise in a short time, the increment speed of the DAC signal must be controlled with high accuracy to meet the I-V characteristic of the charge pump, but this will cause the circuit of controlling the DAC signal of the logic 60 to be complicated. Besides, in this controlling method, the problem of the switching speed of the resistance voltage divider should also be considered.

There is another method to control the rising speed, which can generate the dynamic reference voltage Vref rising linearly. As the voltage-generating circuit 10A shown in FIG. 5, 6A-6C, the comparator 32 of the voltage-generating circuit 10A compares the voltage Vdivide at the node N2 of the resistance voltage divider, with the rising-speed-controlled reference voltage VrefRRC, and outputs the comparison result CMP_OUT to the controlling circuit 40.

FIG. 6A shows the generating circuit 34 to generate the rising-speed-controlled reference voltage VrefRRC. The generating circuit 34 comprises a current mirror and a capacitor, as shown in FIG. 6B, the voltage waveform rises linearly, and stops at the level of the reference voltage Vref. Since the reference voltage VrefRRC is controlled analogy, so no complicated logic is needed. However, because the voltage VrefRRC rises linearly, it cannot meet the I-V characteristic of the charge pump, and cannot follow the output voltage Vpump at the high voltage range, or when it is set to follow, its rising speed becomes very slow, and the pumping ability is wasted at the low voltage range.

In addition, in this method, the regulator will limit the flexibility of the target level set by the charge pump. No matter what the target level is, the rising time of the reference voltage VrefRRC is often the same. Therefore, as shown in FIG. 6C, when the target level is low, the rising speed of the output voltage Vpump becomes gentle (waveform W1); when the target level is high, the rising speed of the output voltage Vpump becomes steep (waveform W2). If the target level is changed by the regulator with each operation, the rising waveform of the output voltage will also vary with each operation. This makes it impossible to set the target level freely with a fixed rising speed of the output voltage.

The present invention provides a voltage-generating circuit with a simple configuration, which uses a dynamic reference voltage, and can control the rising of the generated voltage with high accuracy.

An voltage-generating circuit of the present invention comprises: a voltage-generating part, to generate a voltage; a regulator, electrically connected to the voltage-generating part; and a controlling part, controlling the voltage-generating part based on an output from the regulator; wherein the regulator comprises: a comparator circuit, comparing the voltage generated by the voltage-generating part with a controlled reference voltage having a controlled rising speed; and a generating circuit, delaying a reference voltage according to an RC time constant, and generating the controlled reference voltage.

According to the present invention, the dynamic reference voltage is generated according to the RC time constant, so the configuration of the circuit is simplified, and it is easy to copy the characteristic of the voltage-generating part such as the charge pump according to the RC time constant. By doing this, it can control the rising speed of the generated voltage with high accuracy.

DETAILED DESCRIPTION OF THE INVENTION

The voltage-generating circuit of the present invention can be applied to the semiconductor device that uses the reference voltage to generate the expected voltage. For example, it can be applied to the semiconductor device equipped with the step-up circuit, or the semiconductor device equipped with the step-down circuit. The step-up circuit boosts the external power supply voltage, and the step-down circuit reduces the external power supply voltage. The semiconductor device, for example, can be: the NAND type or the NOR type flash memory, the microprocessor, the microcontroller, the logic, the application specific integrated circuit (ASIC), the processor for processing the video or the audio, or the processor for processing the signal such as the wireless signal, etc.

Figure 7:
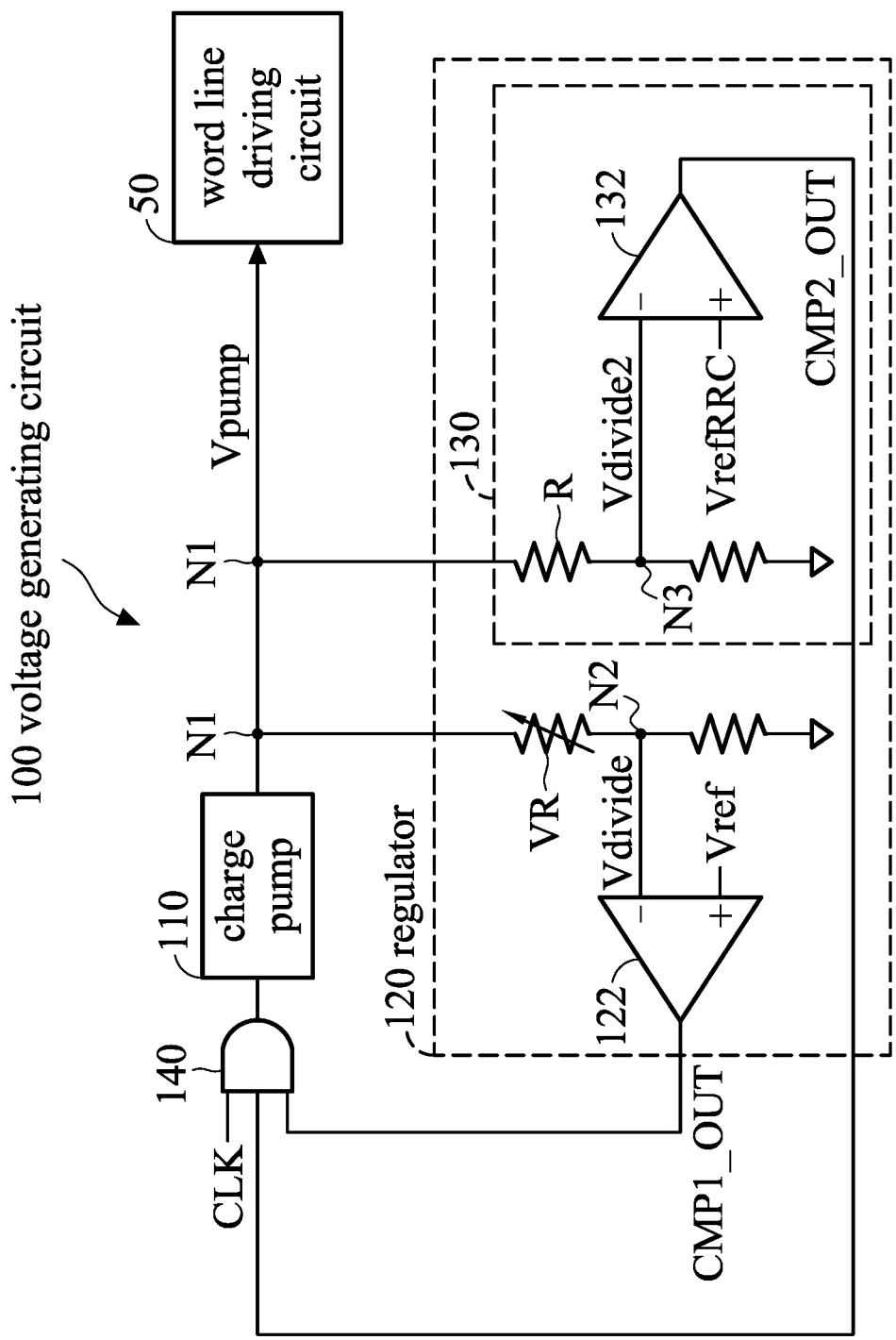
FIG. 7 shows the configuration of the voltage-generating circuit according to the first embodiment of the present invention.

Next, the embodiment of the present invention will be described with reference to the drawings. FIG. 7 shows the configuration of the voltage-generating circuit according to the first embodiment of the present invention. As shown in FIG. 7, the voltage-generating circuit 100 comprises a charge pump 110, a regulator 120, and a controlling circuit 140. The output voltage Vpump generated by the charge pump 110 can be provided to the internal circuit of the semiconductor device, for example, it can be provided to the word line driving circuit 50 of the NAND type flash memory.

The regulator 120 has two functions: firstly, to set the output voltage Vpump of the charge pump 110 to the target voltage by the comparator 122; secondly, to control the rising speed of the output voltage Vpump so as to meet the pumping ability of the charge pump 110 in the worst case.

Figure 1:
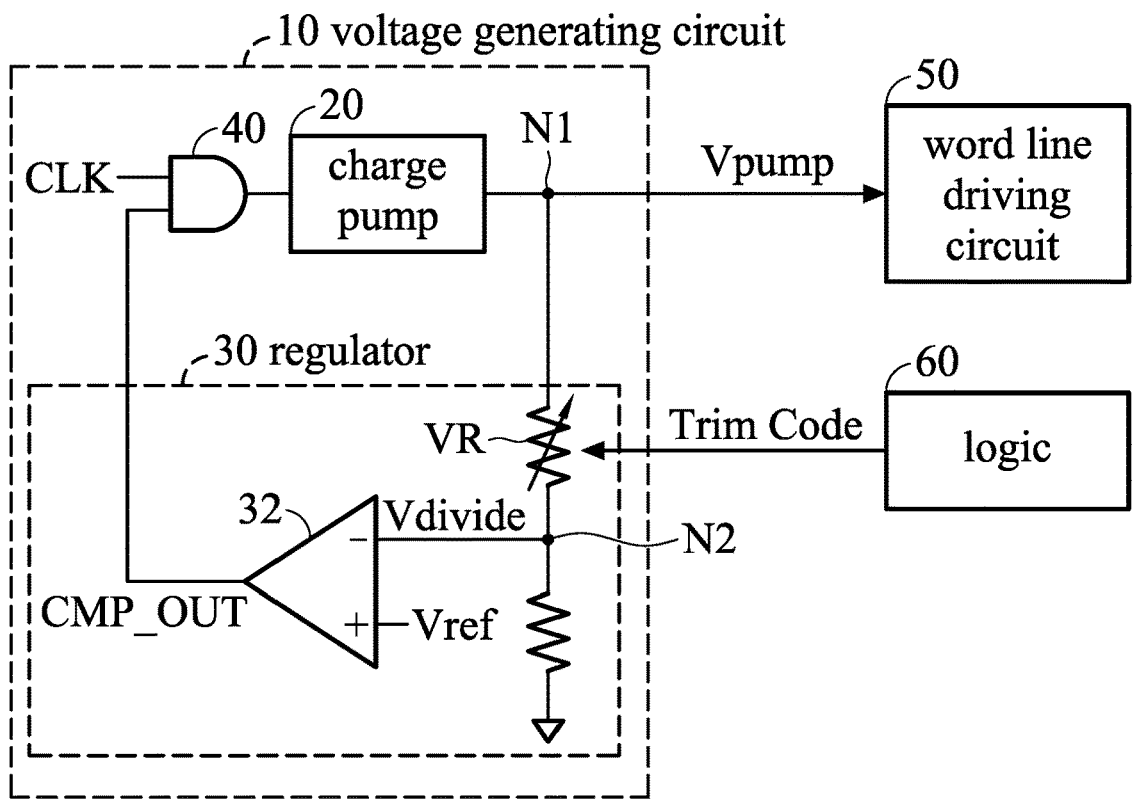
FIG. 1 shows the configuration of the conventional voltage-generating circuit.
Figure 2A:
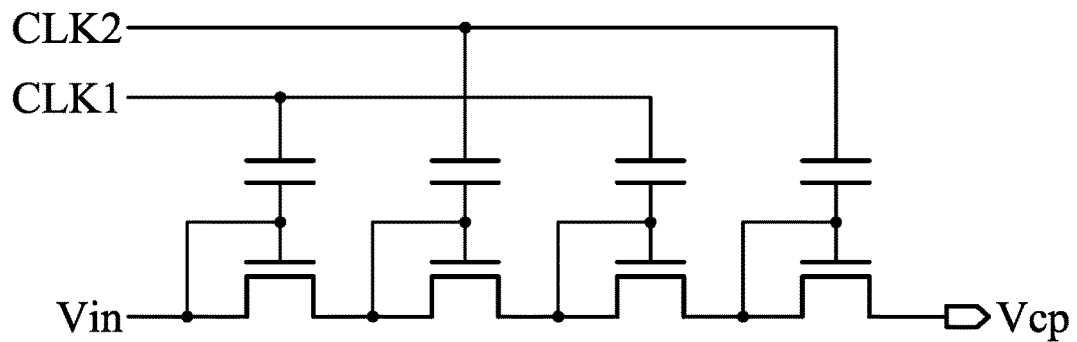
FIG. 2A-2B shows an example of the charge pump.
Figure 2B:
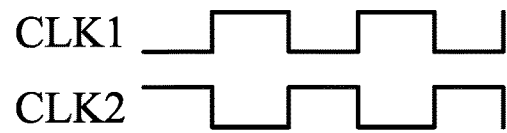
Figure 3:
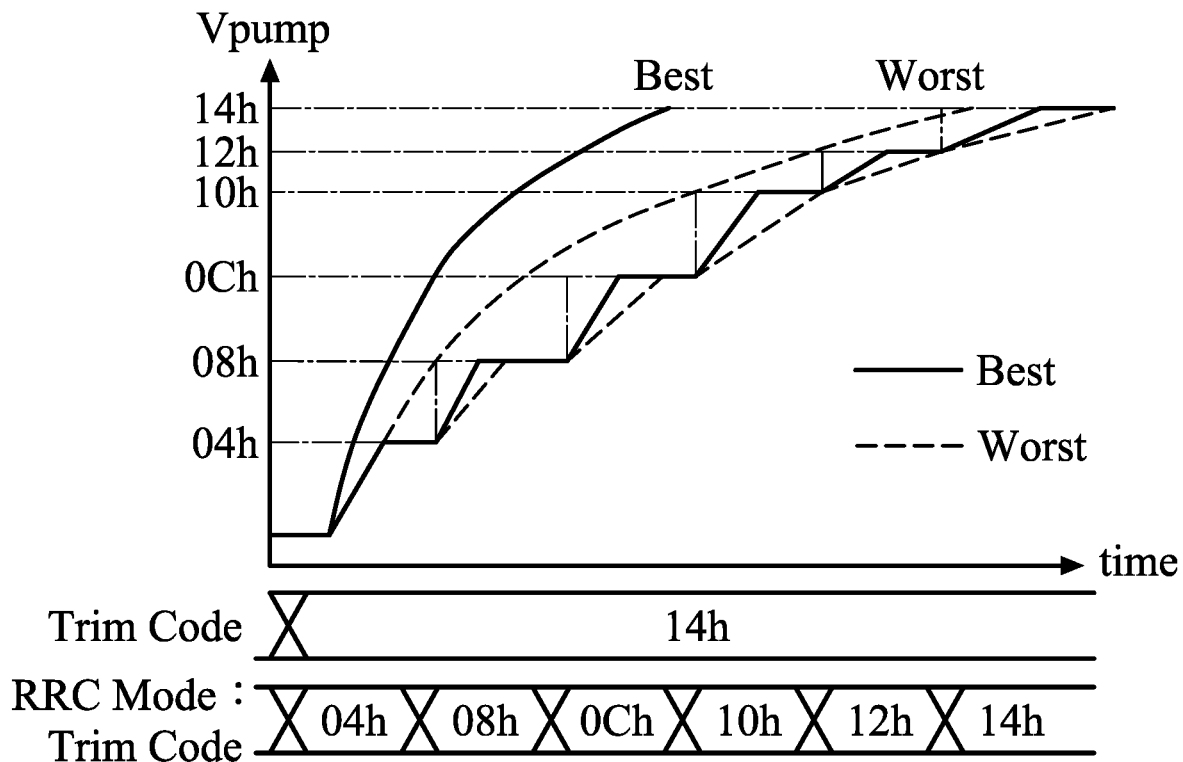
FIG. 3 is the waveform of the voltage output from the voltage-generating circuit shown in FIG. 1.

The regulator 120 comprises a resistance voltage divider and a comparator 122, which is the same as the voltage-generating circuit 10 shown in FIG. 1. The resistance voltage divider is connected between the output node N1 and the ground. The comparator 122 compares the voltage Vdivide at the node N2 generated by the resistance voltage divider, with the reference voltage Vref generated by, for example, the band gap reference, and outputs the comparison result CMP1_OUT to the controlling circuit (AND gate) 140. In this embodiment, the regulator 120 further comprises the circuit 130. The circuit 130 includes another resistance voltage divider, a comparator 132, and a generating circuit 134 (referring to FIG. 8A). Another resistance voltage divider is connected between the output node N1 and the ground. The comparator 132 compares the voltage Vdivide2 at the node N3 generated by the another resistance voltage divider, with the rising-speed-controlled reference voltage VrefRRC, and outputs the comparison result CMP2_OUT to the controlling circuit 140. The generating circuit 134 generates the rising-speed-controlled reference voltage VrefRRC.

The voltage Vdivide2 at the node N3 is the reduced voltage after the output voltage Vpump passes through the resistor R; the ratio of the resistance voltage divider that generates the voltage Vdivide2 at the node N3 is determined based on the I-V characteristic in the PVT condition in the worst case of the charge pump 110. Specifically, the resistance ratio can be set such that when the output voltage Vpump becomes Vmax (FIG. 4A), the voltage Vdivide2 is equal to the reference voltage Vref.

Figure 8B:
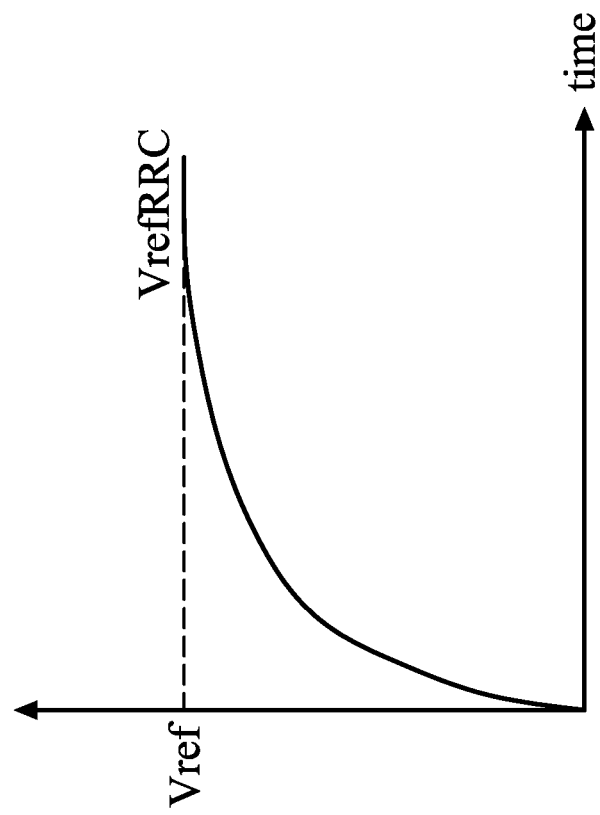
FIG. 8B shows the waveform of the rising-speed-controlled reference voltage.
Figure 8A:
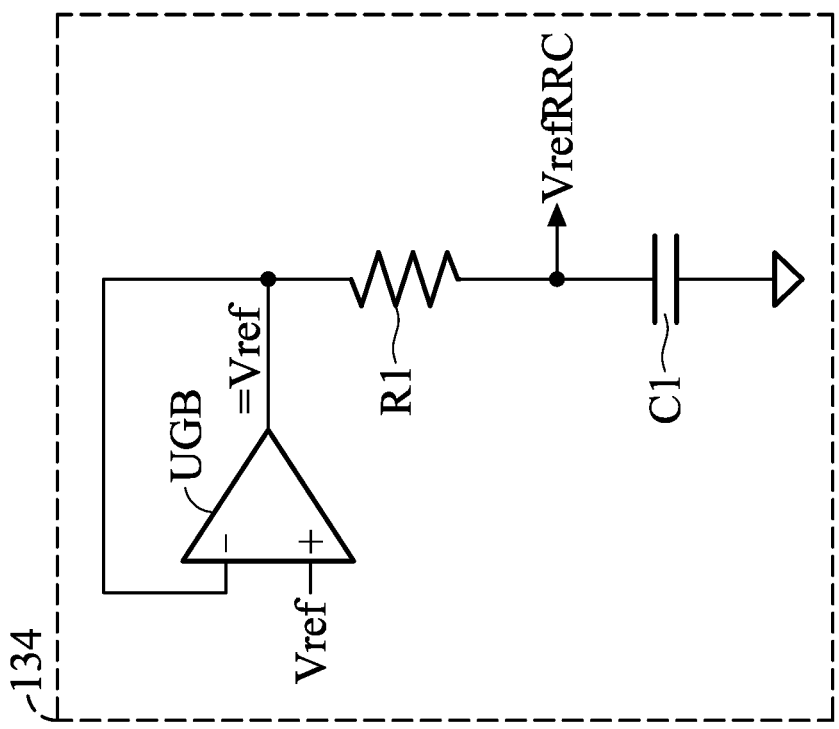
FIG. 8A shows the configuration of the circuit generating the rising-speed-controlled reference voltage shown in FIG. 7.

The generating circuit 134 providing the reference voltage VrefRRC is shown as FIG. 8A, which comprises: a unit gain buffer UGB, of which the output terminal is connected back to the inverting input terminal, and the reference voltage Vref is input to the non-inverting input terminal; and a resistor R1 and a capacitor C1, connected to the output of the unit gain buffer UGB in series. The reference voltage VrefRRC is output from the connected node of the resistor R1 and the capacitor C1. That is, the reference voltage VrefRRC has an exponential function voltage waveform by delaying the reference voltage Vref according to the RC time constant of the resistor R1 and the capacitor C1 (as shown in FIG. 8B), so its rising speed is controlled. The RC time constant of the generating circuit 134 is set to equal the RC time constant of the rising waveform output from the charge pump 110 in the worst case. In addition, the worst case can be known by circuit simulation or sample evaluation.

Next, the operation of the voltage-generating circuit 100 according to this embodiment will be described. The variable resistor VR is set in response to the operation of the flash memory according to the trim code from the logic (not shown). For example, the resistance of the variable resistor VR can be changed for generating every kinds of voltage required during such as reading operation, programming operation, or erasing operation.

The comparator 122 compares the voltage Vdivide with the reference voltage Vref, when the voltage Vdivide is lower than the reference voltage Vref, the comparator 122 outputs the comparison result CMP1_OUT in H level; after the voltage Vdivide reaches the reference voltage Vref, the comparator 122 outputs the comparison result CMP1_OUT in L level. By this way, after the output voltage Vpump reaches the target voltage, the comparator 122 outputs the comparison result CMP1_OUT in L level, and disables the operation of the charge pump 110 through the controlling circuit 140. Subsequently, it can also be designed to disconnect the comparator 132 from the resistance voltage divider of the circuit 130, to minimize current consumption.

The comparator 132 simulates the pumping ability of the charge pump 110 in the worst case, and compares the rising-speed-controlled reference voltage VrefRRC with the voltage Vdivide2 at the node N3, when the voltage Vdivide2 is lower than the reference voltage VrefRRC, the comparator 132 outputs the comparison result CMP2_OUT in H level; after the voltage Vdivide2 reaches the reference voltage VrefRRC, the comparator 132 outputs the comparison result CMP2_OUT in L level. Before the output voltage Vpump reaches the target voltage, when the rising speed of the output voltage Vpump reaches the rising speed of the reference voltage VrefRRC, the comparator 132 outputs the comparison result CMP2_OUT in L level, and stops the operation of the charge pump 110 through the controlling circuit 140. Subsequently, if the voltage Vdivide2 is lower than the reference voltage VrefRRC, the comparator 132 outputs the comparison result CMP2_OUT in H level, and restarts the operation of the charge pump 110. In this way, the rising-speed-controlled output voltage Vpump can be generated, and the output voltage Vpump approximates the exponential function curve of the charge pump 110 in the worst case.

The voltage-generating circuit 100 according to this embodiment has the following effect: the rising-speed-controlled reference voltage VrefRRC will trace the exponential function of the RC time constant which is the same as or approximate to the original pump rising behavior of the charge pump 110, so it can make Vpump have a rising speed with high accuracy without complicated logic control.

In addition, the comparator 122 of the present invention is only used to determine the target level of the charge pump, and the newly added comparator 132 is only used to control the rising speed of the output voltage Vpump. Therefore, the target level will not be affected by the behavior of the rising-speed-controlled reference voltage VrefRRC, and the target level can be set flexibly.

Figure 4A:
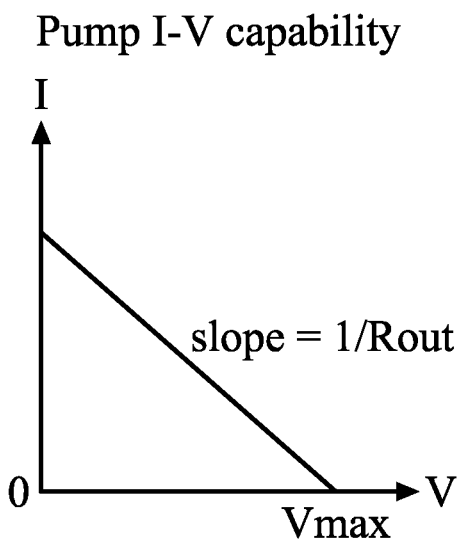
FIG. 4A shows the I-V characteristic of the charge pump.
Figure 4B:
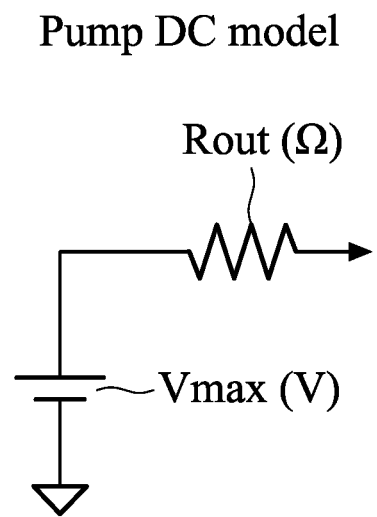
FIG. 4B is the DC model diagram of the charge pump.
Figure 5:
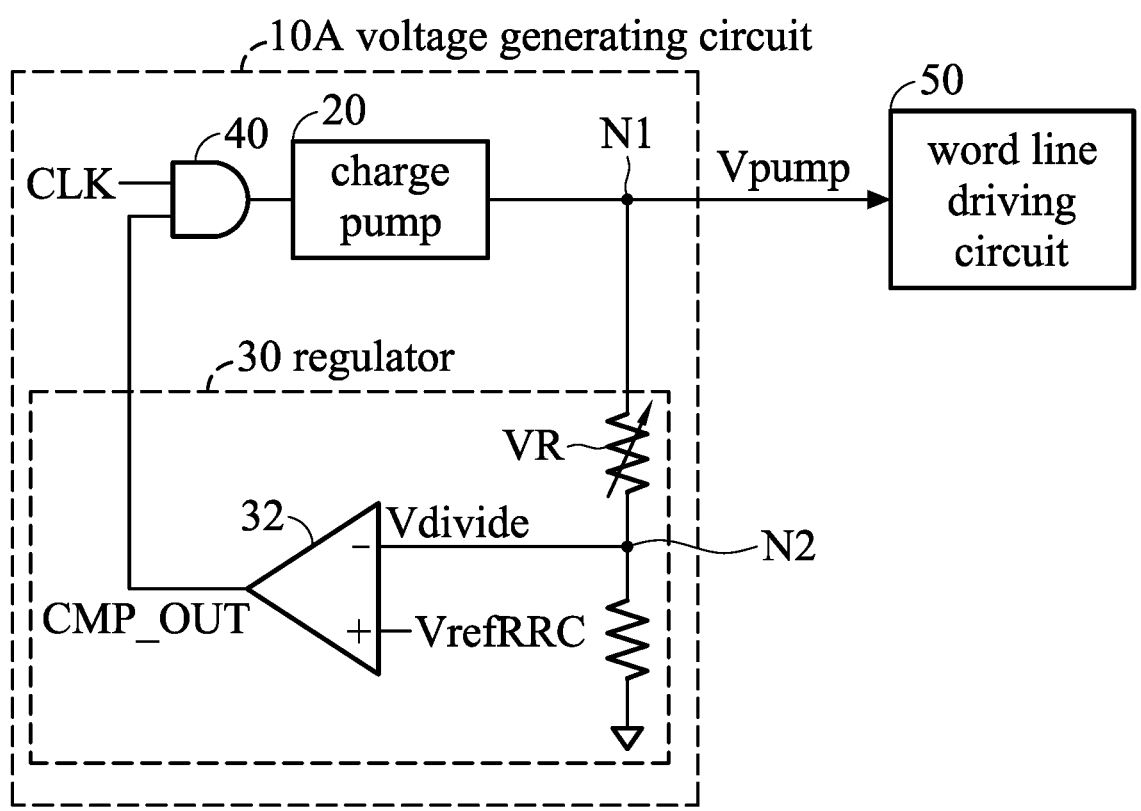
FIG. 5 shows the configuration of the conventional voltage-generating circuit using the rising-speed-controlled reference voltage.
Figure 6A:
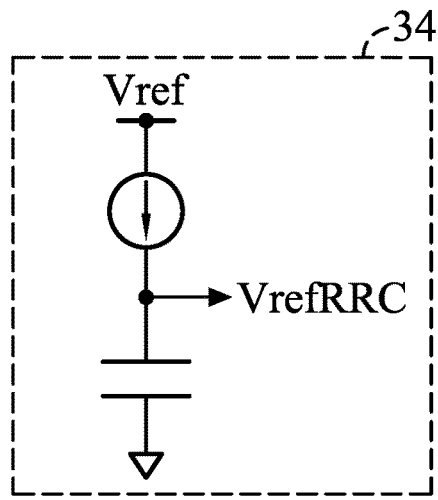
FIG. 6A shows the configuration of the circuit generating the rising-speed-controlled reference voltage shown in FIG. 4.
Figure 6B:
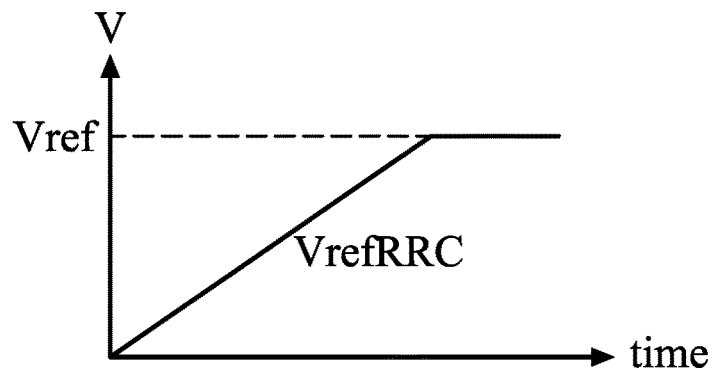
FIG. 6B shows the waveform of the rising-speed-controlled reference voltage.
Figure 6C:
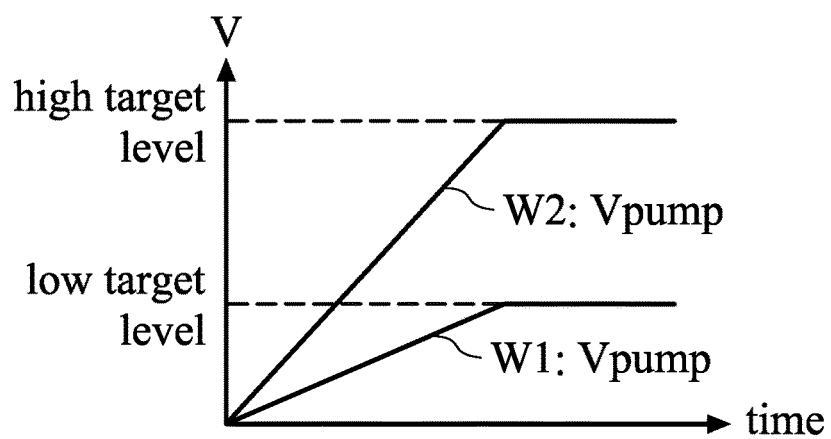
FIG. 6C shows the waveform of the output voltage when the target level determined according to the trim code is low or high.
Figure 9:
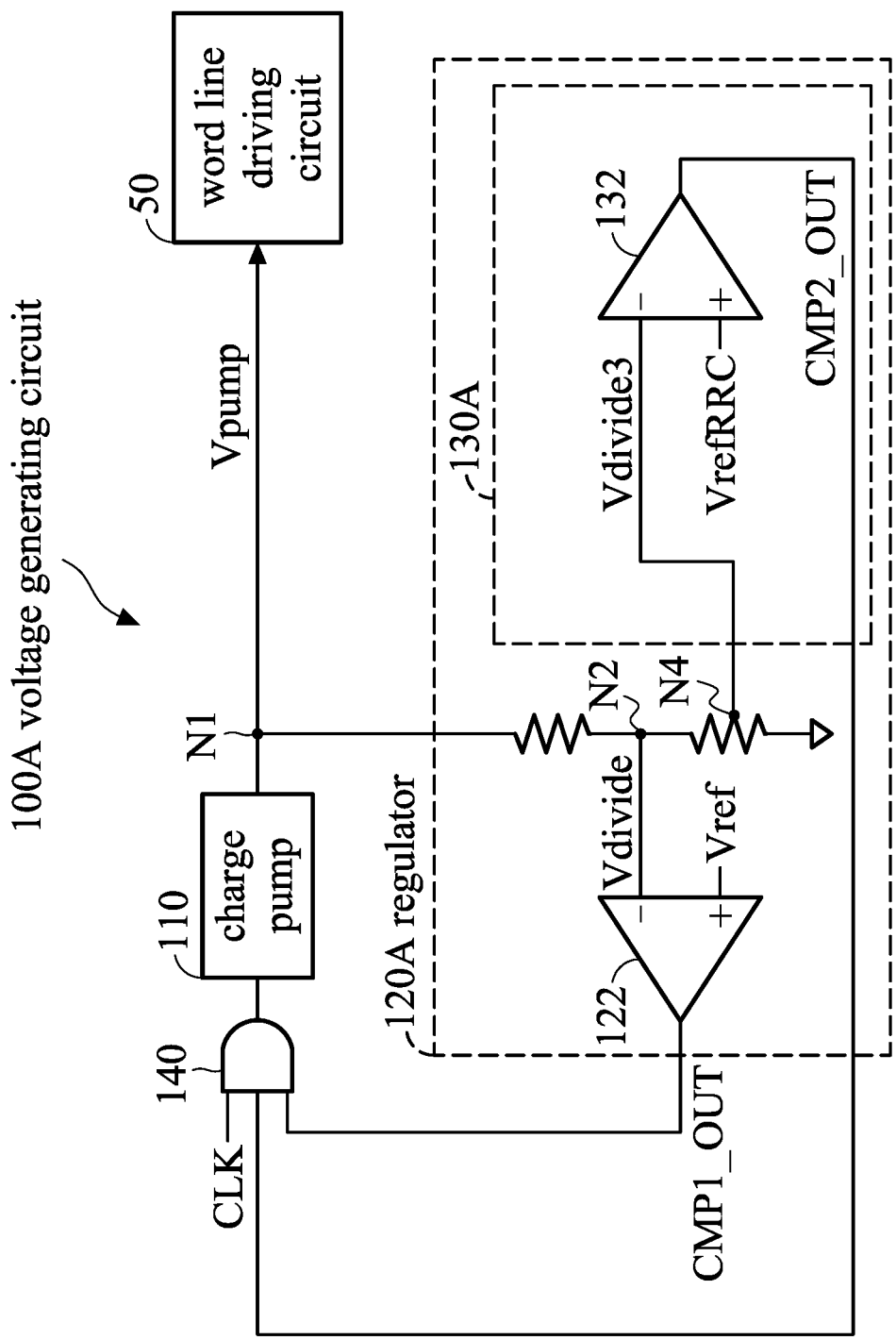
FIG. 9 shows the configuration of the voltage-generating circuit according to the second embodiment of the present invention.

FIG. 9 shows the configuration of the voltage-generating circuit 100A according to the second embodiment of the present invention. The same number of the element in this figure indicates the configuration same as the first embodiment, and will not be described. The difference between the second embodiment and the first embodiment is that: the circuit 130A in the second embodiment does not comprise the another resistance voltage divider; instead, the voltage Vdivide3 at the node N4 of the resistance voltage divider is provided to the inverting input terminal of the comparator 132. The voltage Vdivide3 is the value set to the reference voltage Vref when the output voltage Vpump becomes Vmax (FIG. 4A). Similar to the first embodiment, the rising-speed-controlled reference voltage VrefRRC generated by the generating circuit 134 is provided to the non-inverting input terminal.

If the target voltage of the charge pump does not change with the operating condition, in other words, when the target voltage is constant, then as to this embodiment, by making the comparator 122 and the comparator 132 share the resistance voltage divider, the layout area is reduced, the DC current consumption of the resistance voltage divider is reduced, and the more simplified voltage-generating circuit 100A is obtained.

Figure 10:
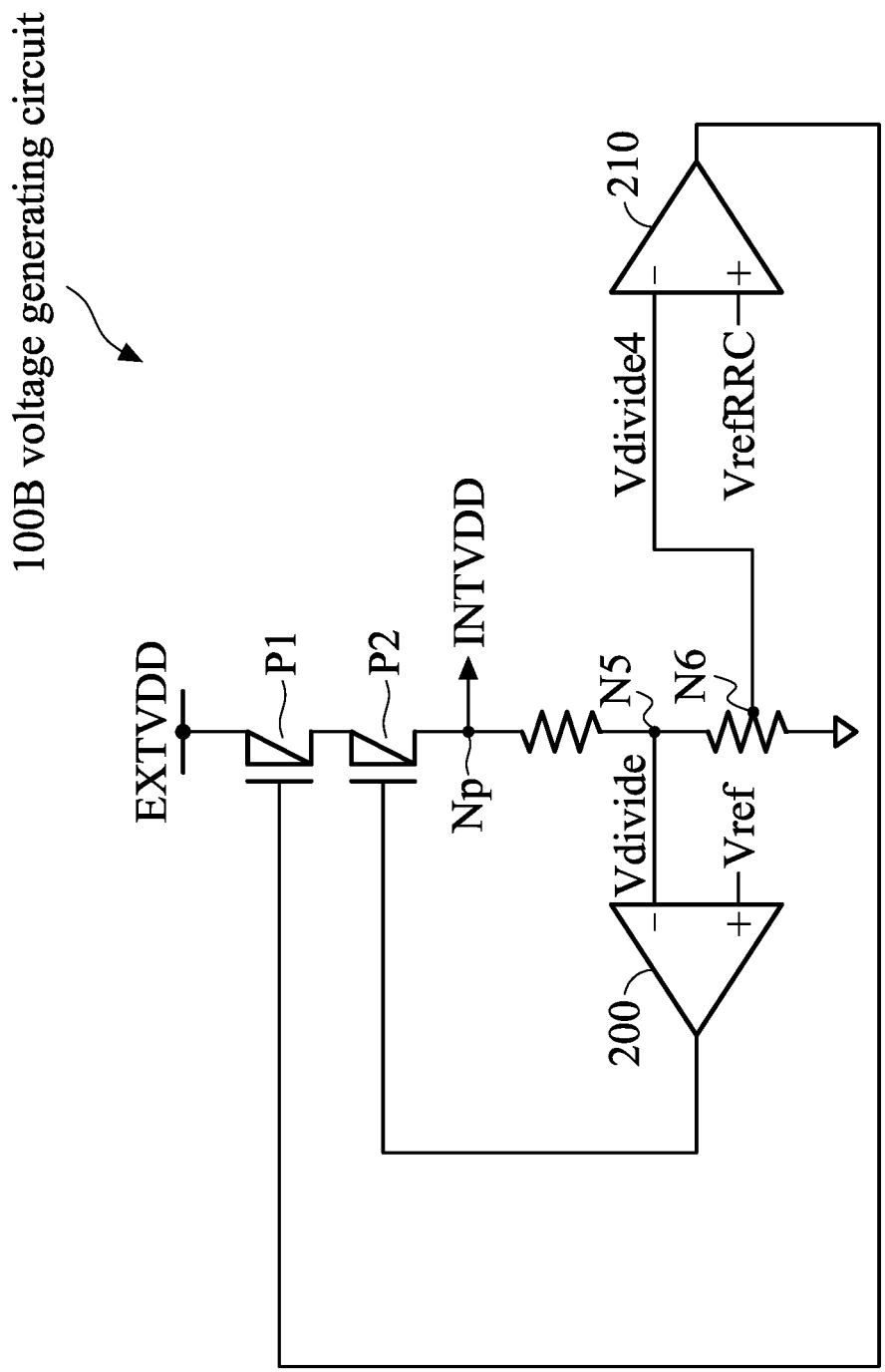
FIG. 10 shows the configuration of the voltage-generating circuit according to the third embodiment of the present invention.

FIG. 10 shows the configuration of the voltage-generating circuit 100B according to the third embodiment of the present invention. This voltage-generating circuit 100B is applied to the step-down circuit. The voltage-generating circuit 100B comprises PMOS transistors P1 and P2, a resistance voltage divider, an operational amplifier (differential amplifier) 200, and an operational amplifier 210. The PMOS transistors P1 and P2 are connected in series between the external power supply voltage EXTVDD and the node Np. The resistance voltage divider is connected between the node Np and the ground. The operational amplifier 200 inputs the voltage Vdivide shown at the node N5 of the resistance voltage divider and the reference voltage Vref, the output corresponding to the difference of two voltages is connected to the gate of the transistor P2. The operational amplifier 210 inputs the voltage Vdivide4 shown at the node N6 of the resistance voltage divider and the rising-speed-controlled reference voltage VrefRRC, the output corresponding to the difference of two voltages is connected to the gate of the transistor P1. Wherein the voltage-generating circuit 100 outputs the reduced internal voltage INTVDD from the node Np.

The transistors P1 and P2 work as the current source controlled by the operational amplifiers 200 and 210. When the internal voltage INTVDD reaches the target voltage, the operational amplifier 200 limits the current flowing through the transistor P2; when the rising speed of the internal voltage INTVDD reaches the speed of the reference voltage VrefRRC, the operational amplifier 210 limits the current flowing through the transistor P1.

In this way, according to this embodiment, by using the rising-speed-controlled reference voltage VrefRRC in the voltage-generating circuit 100B, the internal voltage INTVDD whose rising speed is not higher than a certain speed can be generated.

In the above embodiments, the generated voltage is the voltage applied to the word line driving circuit or the P-well of the NAND type flash memory schematically; however, the present invention is not limited to this, and the generated voltage can also be applied to other semiconductor devices that require the rising speed of the voltage should meet the RC time constant. In addition, the controlling circuit is not limited to the AND gate, and can be any circuit/element that can control the charge pump based on the outputs of the comparators 122 and 132.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A voltage-generating circuit, comprising:
a voltage-generating part, to generate a voltage;
a regulator, electrically connected to the voltage-generating part; and
a controlling part, controlling the voltage-generating part based on an output from the regulator;
wherein the regulator comprises:
a comparator circuit, comparing the voltage generated by the voltage-generating part with a controlled reference voltage having a controlled rising speed; and
a generating circuit, delaying a reference voltage according to an RC time constant, and generating the controlled reference voltage;
wherein the regulator further comprises a second comparator circuit, comparing a second voltage generated by the voltage-generating part with the reference voltage, and outputting a comparison result to the controlling part;
wherein the controlling part restrains the operation of the voltage-generating part after the second voltage reaches the reference voltage.

2. The voltage-generating circuit as claimed in claim 1, wherein the generating circuit comprises:
an input part, inputting the reference voltage; and
an RC circuit, connected to the input part.

3. The voltage-generating circuit as claimed in claim 2, wherein the RC circuit comprises:
a resistor, connected to the reference voltage; and
a capacitor, connected in series with the resistor;
wherein the controlled reference voltage is output from a connected node of the resistor and the capacitor.

4. The voltage-generating circuit as claimed in claim 1, wherein the voltage-generating part comprises a charge pump;
wherein the RC time constant is determined within a range that does not exceed a rising speed of an output voltage of the charge pump.

5. The voltage-generating circuit as claimed in claim 1, wherein the controlling part restrains operation of the voltage-generating part in response to the comparator circuit detecting that a rising speed of the voltage generated by the voltage-generating part is faster than that of the controlled reference voltage.

6. The voltage-generating circuit as claimed in claim 1, wherein the second comparator circuit includes a resistance voltage divider, and the resistance voltage divider comprises a variable resistor;
wherein the second voltage is set by the variable resistor.

7. The voltage-generating circuit as claimed in claim 6, wherein a resistance of the variable resistor is set according to a trim code which is determined by operating status.

8. A semiconductor device, comprising:
the voltage-generating circuit as claimed in claim 1.

* * * * *